United States Patent
Holsomback

(10) Patent No.: US 7,973,672 B2
(45) Date of Patent: Jul. 5, 2011

(54) FALLEN CONDUCTOR WARNING SYSTEM HAVING A DISRUPTION ASSEMBLY

(75) Inventor: Van L. Holsomback, Marietta, GA (US)

(73) Assignee: The Southern Company, Atlanta, GA (US)

( * ) Notice: Subject to any disclaimer, the term of this patent is extended or adjusted under 35 U.S.C. 154(b) by 501 days.

(21) Appl. No.: 12/197,378

(22) Filed: Aug. 25, 2008

(65) Prior Publication Data

US 2009/0103224 A1 Apr. 23, 2009

Related U.S. Application Data

(60) Provisional application No. 60/981,366, filed on Oct. 19, 2007.

(51) Int. Cl.
*G08B 21/00* (2006.01)
(52) U.S. Cl. .................. 340/686.1; 340/540; 174/40 R
(58) Field of Classification Search .............. 340/686.1, 340/687, 540; 174/40 R–45 R
See application file for complete search history.

(56) References Cited

U.S. PATENT DOCUMENTS

| | | | |
|---|---|---|---|
| 2,133,005 A | 10/1938 | Wollenweber | |
| 2,912,600 A | 11/1959 | Isenberg | |
| 3,003,045 A | 10/1961 | Tichenor | |
| 3,230,327 A | 1/1966 | McDowell | |
| 3,634,638 A | 1/1972 | Even-Tov | |
| 3,761,865 A | 9/1973 | Bomgaars et al. | |
| 3,763,482 A | 10/1973 | Burney et al. | |
| 3,789,130 A | 1/1974 | Parker | |
| 4,030,061 A | 6/1977 | Gaskell et al. | |
| 4,195,192 A | 3/1980 | Hackney et al. | |
| 4,446,892 A | 5/1984 | Maxwell | |
| 4,676,485 A | 6/1987 | Ciordinik et al. | |
| 4,737,776 A | 4/1988 | Wireman | |
| 5,046,252 A | 9/1991 | Ayuta et al. | |
| 5,134,362 A | 7/1992 | Ochi | |
| 5,852,402 A | 12/1998 | Perry | |
| 6,334,474 B1 | 1/2002 | Rababy et al. | |
| 7,035,068 B2 | 4/2006 | Shea | |
| 2002/0113704 A1 | 8/2002 | Hess | |
| 2006/0169470 A1 | 8/2006 | Bell | |
| 2007/0041333 A1 | 2/2007 | Twitchell, Jr. | |

FOREIGN PATENT DOCUMENTS

JP 2273014 11/1990

*Primary Examiner* — Jeffery Hofsass
(74) *Attorney, Agent, or Firm* — Ryan A. Schneider, Esq.; Dustin B. Weeks, Esq.; Troutman Sanders LLP

(57) ABSTRACT

A system for notifying and/or warning of fallen or downed insulated conductor generally includes a distribution system for distributing a utility, such as power, and a sensor system for sensing whether the distribution system is properly operating. The warning system can include a support structure; an arm carried by the support structure and extending outwardly therefrom; a distribution system providing a utility via at least one wire, the wire held aloft from a below surface via the arm; a communication cable transmitting a signal; a disruption assembly carrying the communication cable and in communication with the support structure. The disruption assembly is loaded with the potential of disrupting the signal transmitted by the communication cable; and a sensor system is adapted to monitor the distribution system based on the signal transmitted by the communication cable.

21 Claims, 6 Drawing Sheets

FALLEN CONDUCTOR WARNING SYSTEM HAVING A DISRUPTION ASSEMBLY

CROSS REFERENCE TO RELATED APPLICATION

This application claims benefit, under 35 U.S.C. §119(e), of U.S. Provisional Application Ser. No. 60/981,366, filed 19 Oct. 2007, the entire contents and substance of which are hereby incorporated by reference.

BACKGROUND

Embodiments of the present invention relate to a notification system and, more particularly, to a warning system that provides notification of fallen wires.

Insulated conductors are wire conductors that are covered by an insulated shell, such as rubber, and are well-known in the art. Insulated conductors, sometimes called covered conductors, were developed to reduce failure rates compared to the more conventional bare-wire conductors, and improve security and reliability of the conductors. The additional investment cost of insulated conductors over bare-wire conductors is often fully compensated by savings in: line spacing, reduced maintenance, and a better reliability of an electrical network. Typically, insulated conductors are used in distribution systems, rather than larger transmission systems, and are thus positioned throughout neighborhoods and at lower elevations.

A significant advantage of insulated conductors over bare-wire conductors is each conductor can be positioned near/close to another conductor, and yet still remains insulated from one another. This close positioning significantly reduces line spacing between or among conductors. Accordingly, insulated conductors can be weaved through a number of trees to provide electricity to tree-dense areas. Another advantage of insulated conductors is they can be in direct contact with an object, for example, a tree, and this contact will not create a short circuit or a cause a fire. Moreover, insulated conductors can eliminate the need of large, elongated, external insulators.

Insulated conductors are most often positioned between tree limbs, branches, and trunks, and thus are sometimes referred to as "tree wires." Frequently, the tree wires fall due to a tree, branch, or pole falling upon them. As a result, the insulated conductor can lie on the ground. Although a short circuit does not exist due to the insulation properties of the conductor covering, if a person were to touch the insulated conductor, the person could be severely injured, even fatally.

When insulated conductors fall, utility companies, particularly power companies, need to be notified as soon as possible. Utility companies currently have procedures in place to notify them of fallen power lines, but typically these procedures are effective only if the conductors create a short circuit condition. This notification system relies upon relays or fuses to detect the high current conditions and subsequently de-energize the line.

In order to determine whether the insulated conductor is down, the power company must send out one or more line operators to "drive the lines", or drive along the insulated conductors to visually confirm whether an insulated conductor is down. Driving the lines is an expensive task and relies on human perfection; plus, it wastes valuable time. If an insulated conductor fell, and the line operator were to arrive after a person grabbed the insulated conductor, an unfortunate, and rather serious, injury could occur.

SUMMARY

Briefly described, embodiments of the present invention include a system for notifying and/or warning of a fallen wire or cable.

In an exemplary embodiment, the warning system comprises a support, an arm, a communication system, and a wire to be monitored. The support is a general vertical structure, such as a power pole or tree, but can be an approximate horizontal structure, such as a bottom portion of a bridge. The support carries the arm, which is coupled thereto and carries a portion of the communication system and the wire. The communication system is adapted to communicate that an event, such as falling of the wire, has occurred. The communication system can provide a signal communicating to an operator that the event has occurred and thus can protect and ensure citizen's safety by killing power to a given area.

In an exemplary embodiment, a system for notifying and/or warning of fallen or downed wire generally includes a distribution system for distributing a utility through the wire, e.g., power, and a sensor system for sensing whether the distribution system is properly operating. The warning system can include a support structure; an arm carried by the support structure and extending outwardly therefrom; a distribution system providing a utility via at least one wire, the wire held aloft from a below surface via the arm; a communication cable transmitting a signal; a disruption assembly carrying the communication cable and in communication with the support structure. The disruption assembly is loaded with the potential of disrupting the signal transmitted by the communication cable; and a sensor system is adapted to monitor the distribution system based on the signal transmitted by the communication cable.

In an exemplary embodiment, the system notifies and warns, specifically, of a fallen or downed insulated conductor. The notification/warning system for a fallen insulated conductor includes a distribution system for distributing a utility, such as electricity, and a sensor system for sensing whether the distribution system is properly operating.

The distribution system includes a power pole, an arm, a messenger, a hanger system, and at least one insulated conductor. To distribute electricity, there are a plurality of power poles in proximity to one another for holding conductor(s) aloft. Near the top end of each power pole an arm extends outwardly. Connected near the far end of arm (the end away from the pole) is a messenger. The messenger is a wire, and can be a neutral conductor, for securing the hanger system in place. The hanger system is adapted to secure the insulated conductor(s) in place. Depending on the number of insulated conductors in the distribution system, the shape, size, and features of the hanger system vary. For example, if there are three insulated conductors, often called a bundled conductor, the hanger system can have a diamond shape with a few insulators positioned between the insulated conductors. The messenger is adapted to fully support the hanger system, along with the conductors.

The sensor system for monitoring the distribution system is adapted to sense whether the insulated conductors have fallen. The sensor system includes a sensor for acquiring data related to the distribution system. In one embodiment, the sensor system includes a communication cable, a notification assembly, and a signal processing system. The notification assembly is positioned near the hanger system and the insulated conductors. For example and not limitation, the notification assembly can be positioned integral with the arm, on the arm, on the pole above the hanger system, on the pole below the hanger system, or other convenient places in which fallen insulated conductors can be in communication with the notification assembly.

In an exemplary embodiment, the notification assembly is a disruption assembly. The disruption assembly includes a channel to receive the communication cable, and a disruption, e.g., cutting, device. The communication cable rests within the channel. The communication cable is a fiber optic cable, coaxial cable, or like cable. Additionally, the disruption device of the disruption assembly can be tethered to the messenger of the power distribution system. Upon a disruption of electricity due to, for example and not limitation, a tree branch, tree limb, tree trunk, tree, or power pole falling upon an element of the power distribution system or, alternatively, a power pole holding the power distribution system falling completely, the disruption device of the disruption assembly is pivotable to disrupt, interfere with, alter, pierce and/or slice the communication cable. Upon this occurrence, the signal processing system is notified that there is a downed insulated conductor, or power line. The signal processing system can include a communications device, such as a modem or like device, for remotely transmitting the status of the sensor system.

The signal processing system of the sensor system can provide a signal, either pulsed or continuous, to be transmitted through the communication cable. For example, if the communication cable is a fiber optic cable, the signal processing system can transmit a light signal through the fiber optic cable. The light signal can travel along the communication cable until it reaches either another signal processing system or the same signal processing system that transmitted the light signal in the first case. If, for some reason, the light signal does not reach the designated signal processing system, an operator can be alerted. For example, the operator can be alerted at a distant or remote location. At that time the operator can at least decide whether to prompt with another light signal through the signal processing system, to send a line operator to check on the status of the conductors, and/or kill power to the given area.

For example and not limitation, if an object were to fall on the messenger, the disruption device of the disruption assembly could be activated to cut the communication cable. Then, the signal processing system would be notified that the communication cable was disturbed, and safety procedures can be taken to protect citizens. Also, if the tree branch were to fall on the insulated conductor, the insulated conductor would cause the hanger system to fall, which in turn would pull down the messenger. Based on the fall of the messenger, the disruption device of the disruption assembly is activated and would disrupt the communication cable.

These and other objects, features and advantages of the present invention will become more apparent upon reading the following specification in conjunction with the accompanying drawing figures.

DETAILED DESCRIPTION

Figure 1:
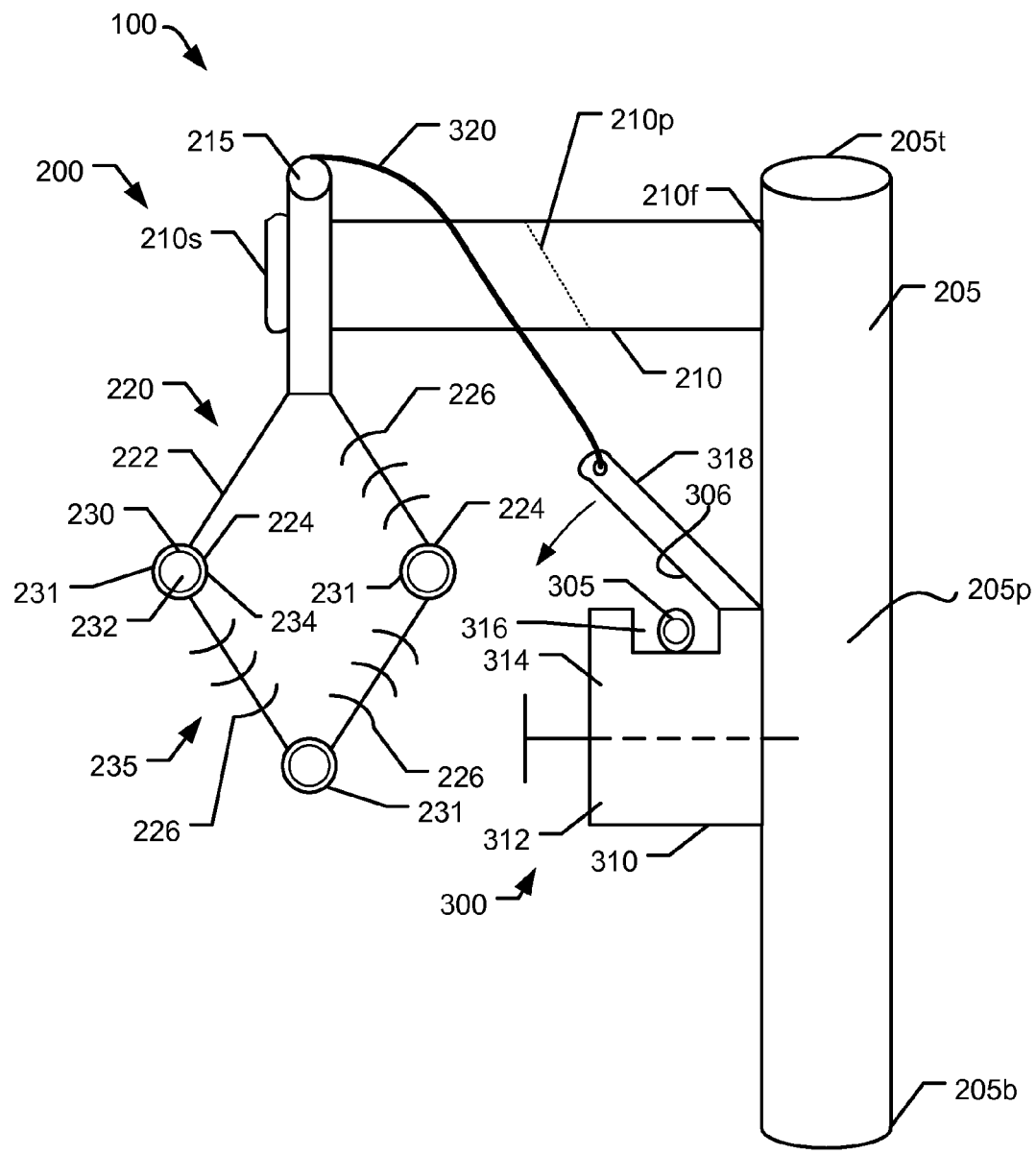
FIG. 1 illustrates a side view of a warning system for notifying/warning of a fallen wire, in accordance with an exemplary embodiment of the present invention.
Figure 2:
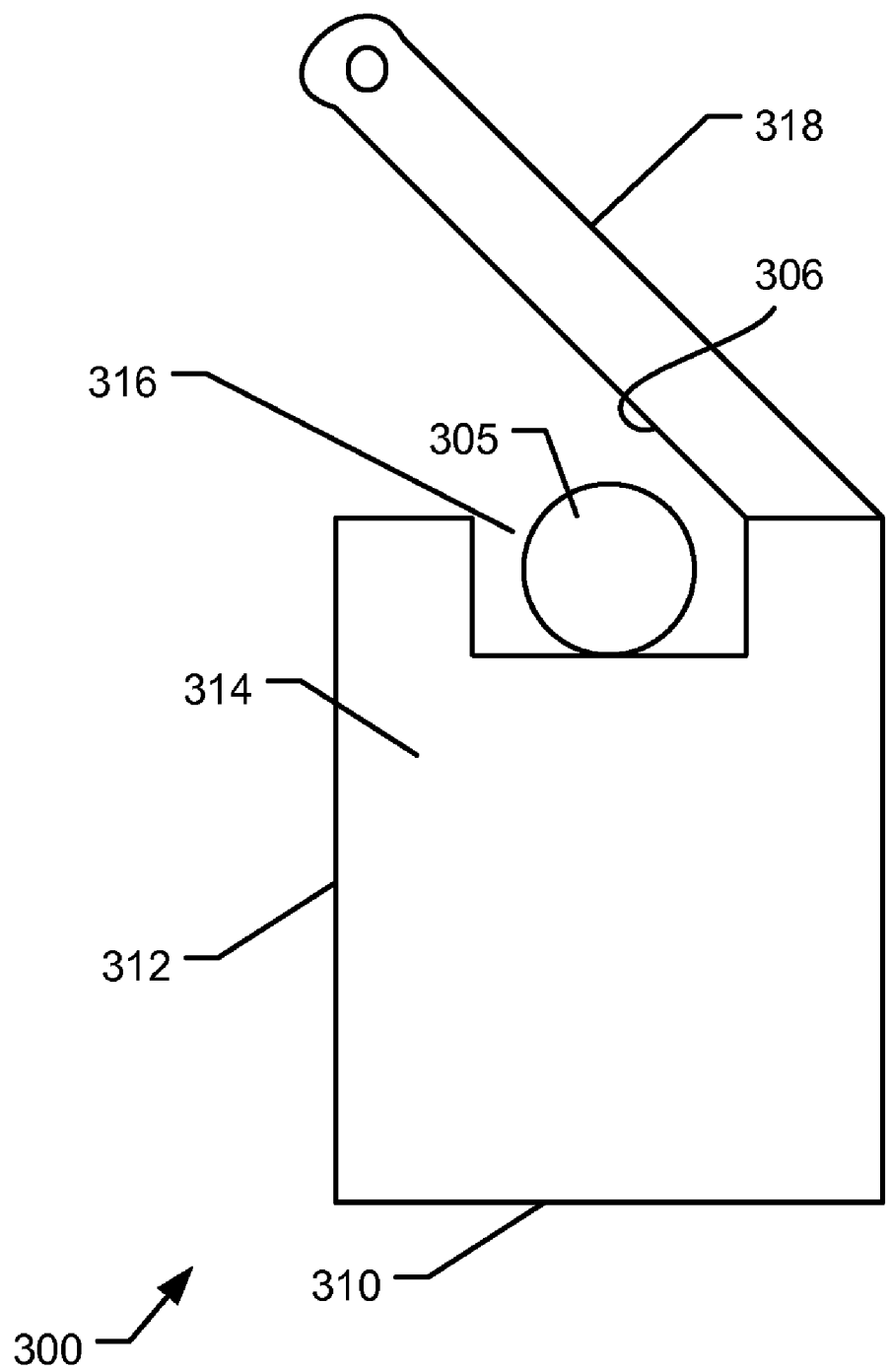
FIG. 2 illustrates a side view a disruption assembly, in accordance with an exemplary embodiment of the present invention.

To facilitate an understanding of the principles and features of embodiments of the invention, they are explained hereinafter with reference to their implementation in an illustrative embodiment. Embodiments of the invention are described in the context of being a warning system for fallen wires or cable, particularly for fallen insulated conductors.

The invention, however, is not limited to its use as a warning system for fallen wires. Rather, the invention can be used when a warning system is desired, or as is necessary. Thus, the warning system described hereinafter as a warning system for fallen conductors can also find utility as a warning system for other applications, beyond that of fallen conductors.

The materials described hereinafter as making up the various elements of the invention are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

Referring now to the figures, wherein like reference numerals represent like parts throughout the view, the warning system will be described in detail.

Embodiments of the present invention relate to a system for notifying and/or warning of a fallen wire or cable, e.g., conductor and/or communication wire (fiber optic, copper wire, etc.).

In an exemplary embodiment, the warning system includes a support, an arm, a communication system, and a wire to be monitored. The support is a general vertical structure, such as a power pole or tree, but can be an approximate horizontal structure, such as a bottom portion of a bridge. The support carries the arm, which is coupled thereto and carries both the communication system and the wire. The communication system is adapted to communicate that an event, such as falling of the wire, has occurred. The communication system can provide a signal communicating to an operator that the event has occurred and thus can protect and ensure citizen's safety by killing power to a given area.

When the system is notifying and/or warning of a fallen conductor, aspects of the present invention include a power distribution system for distributing electrical power, and a sensor system for sensing whether the power distribution system is properly operating.

For example, the power distribution system generally includes a power pole, an arm, a messenger, a hanger system, and at least one insulated conductor. To distribute electricity, there are a plurality of power poles in proximity to one another for holding conductor(s) aloft. Near the top end of each power pole the arm extends outwardly. Connected near the far end of arm (the end away from the pole) is a messenger. The messenger is a wire, and can be a neutral conductor, for securing the hanger system in place. The hanger system is adapted to secure the insulated conductor(s) in place. Depending on the number of insulated conductors in the power distribution system, the shape, size and features of the hanger system can vary. For example, if there are three insulated conductors the hanger system can have a diamond shape with a few small insulators positioned therebetween. The messenger is adapted to fully support the hanger system, along with the conductors.

The sensor system is adapted to sense whether the insulated conductors have fallen. In one embodiment, the sensor system includes a communication cable, a notification assembly, and a signal processing system. Positioned near the hanger system and the insulated conductors is the notification assembly and specifically in a convenient place in which fallen insulated conductors can be in communication with the notification assembly.

In one embodiment, the notification assembly is a cutter assembly. The cutter assembly includes a channel to receive the communication cable, and a cutting device. The communication cable rests within the channel. The communication cable can be a fiber optic cable, coaxial cable, or like cable. Moreover, the cutting device of the cutter assembly is tethered to the messenger of the power distribution system. Upon an event, the cutting device of the cutter assembly pierces and/or slices the communication cable. Upon this occurrence, the signal processing system is notified that there is a downed insulated conductor, or power line. The signal processing system can include a telecommunications device, such as a modem or like device, for remotely transmitting the status of the sensor system.

Figure 4:
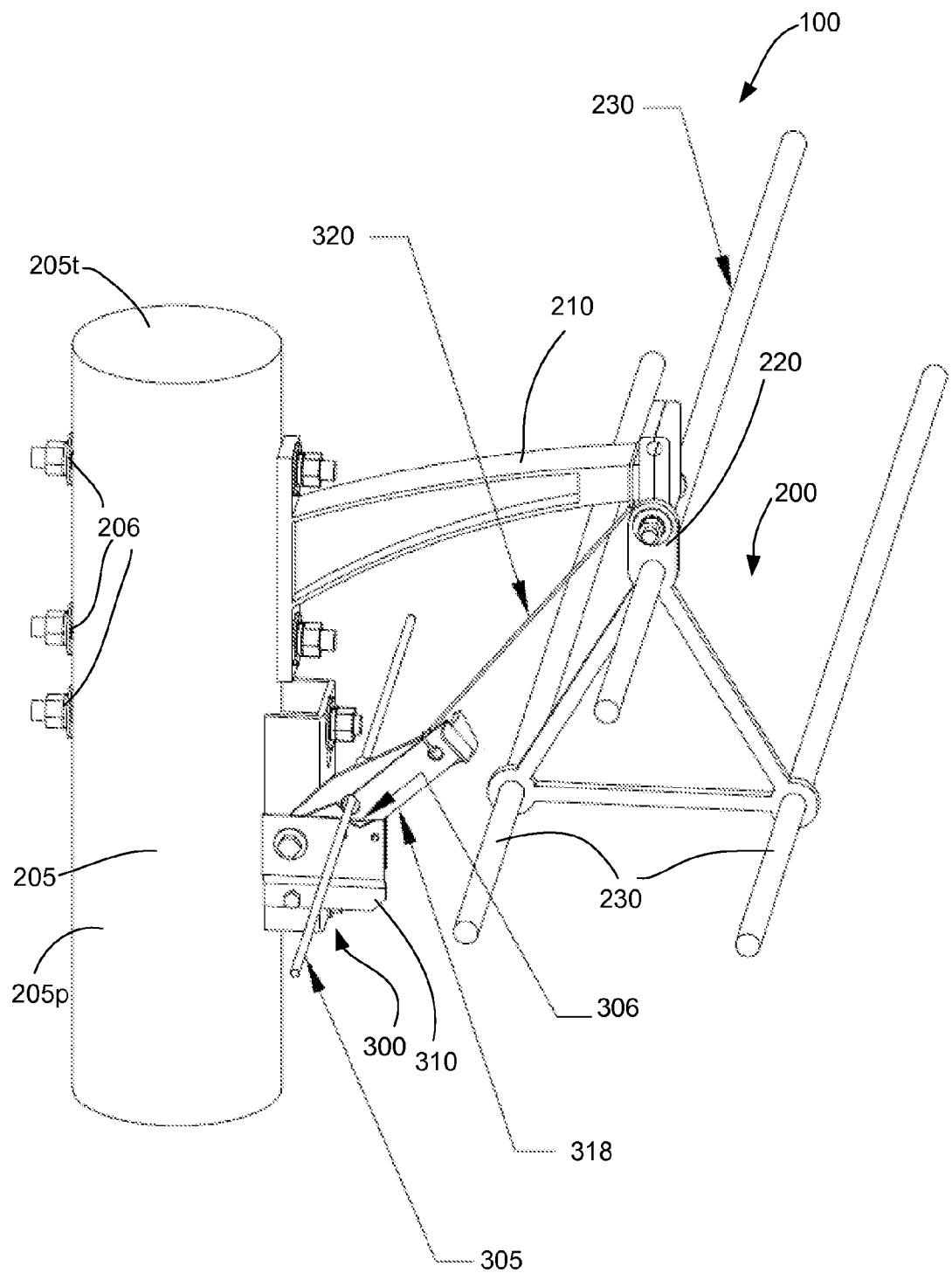
FIG. 4 illustrates a perspective view of the warning system for notifying/warning of a fallen wire, in accordance with an exemplary embodiment of the present invention.
Figure 5:
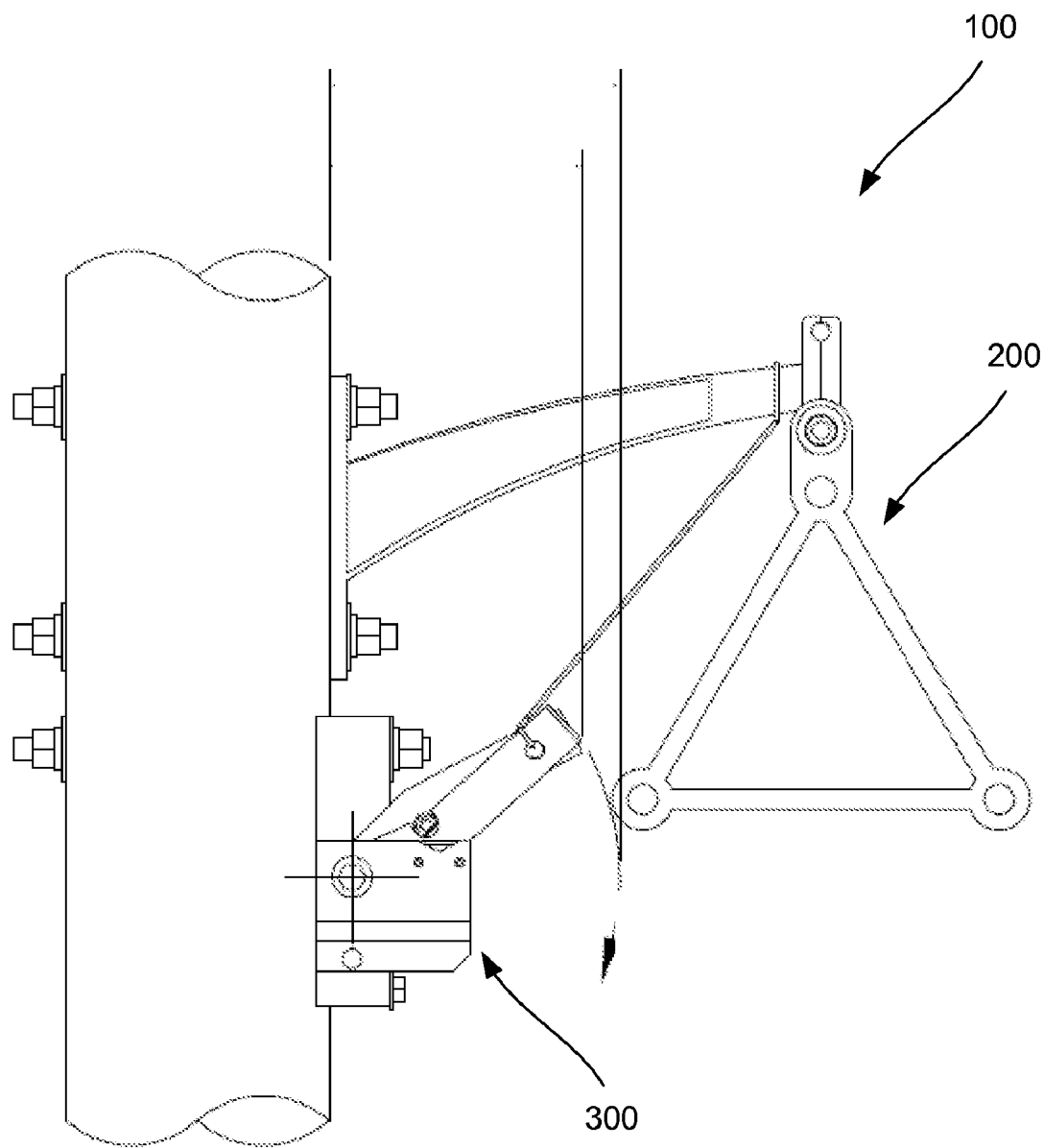
FIG. 5 illustrates another side view of the warning system, in accordance with an exemplary embodiment of the present invention.

Referring now to FIGS. 1 and 4-5, the warning system 100 is illustrated. The warning system 100 includes a distribution system 200 for distributing utilities, e.g., communication, power, or electricity, to consumers, and a sensor system 300 for monitoring the distribution system 200 and, in particular, whether an element of the distribution system 200 has fallen.

The distribution system 200 comprises a support structure 205, an arm 210, a hanger system 220, and wires 230, which are preferably conductors. Optionally, a messenger 215 can be further included in the distribution system 200.

There are a plurality of support structures 205 that extend upwardly or are positioned in an vertical orientation that are positioned distant from one another for holding wires and/or conductors aloft. For example, in an exemplary embodiment, the support structures 205 are power poles 205p that are supported by concrete, distant from one another for supporting wires and/or conductors a desired distance about the ground. Conventional power poles 205p are commonly made of wood, concrete, or steel. It is desired that the power pole 205p be strong enough to hold the wires/conductors aloft, and be of the material such that it is not be compromised due to weather elements (e.g., rain, snow, heat, wind, and the like). The power pole 205p, illustrated in FIGS. 1 and 4, is shown in an upright orientation and is capable of receiving bores. Generally, the power pole 205p includes a top end 205t and a bottom end 205b. The bottom end 205b is secured in the ground, while the top end 205t is positioned upright and above the ground.

The support structure 205 can also be other support surfaces, such as a vertical surface, e.g., building, or a horizontal structure, such as a bridge (connected, for example, beneath the bridge's span).

The arm 210 can be secured near the top end 205t of the power pole 205p. The arm 210 has a first end 210f in communication with the power pole 205p and a second end 210s that is distant from the power pole 205p. For instance, the arm 210 can be bolted to the power pole 205p via one or more bolts 206 that are inserted into bores in the power pole 205p. In this orientation, the arm 210 extends outwardly from near the top end 205t of the power pole 205p. Alternatively, the arm 210 can be secured to the pole 205p by a non-boring means.

The arm 210 can include a release feature, such that it is adaptable to release from the pole 205p. The arm 210 can also include a breakaway feature. Because power poles 205p can be rather difficult and expensive to install, it is desirable that if an object falls on an element of the distribution system 200 that the arm 210 be adapted to release or break, rather than damage/destroy the power pole 205p. For example, the arm 210 can have pivot point 210p, such that the object falling on an element of the distribution system 200 causes the arm 210 to break along the pivot point 210p. Alternatively, the arm 210 can be adapted to release or break from the secured point at the power pole 205p if an element were to fall on the distribution system 200.

The arm 210 can support the messenger 215 aloft. When the system 100 incorporates the messenger 215, the messenger 215 can be positioned near the second end 210s of the arm 210. The messenger 215 extends from one power pole 205p to another, specifically from one arm 210 to another arm 210, and is a thin wire that is used to hold a heavier line or wire. In an exemplary embodiment, the messenger 215 is conductive, and can serve as the neutral line as needed or desired. The messenger 215 can be positioned above or beneath the arm 210.

The messenger 215 is adapted to hold the hanger system 220 in place. Based on this arrangement, the hanger system 220 can securely hold the conductors 230 aloft. The hanger system 220 can comprise a hanger 222, as well as a number of clamps 224 for securing the conductors 230.

The hanger 222 can hang from the arm 210. Generally, the hanger 222 can be adapted to hang from the messenger 215. Clamps 224 can be used to secure the conductors 230 to the hanger 222. The clamps 224 define a channel sufficiently large enough to receive and secure the conductors 230. The hanger 220 can have a variety of shapes and sizes, which can be dependent on the number of conductors 230 being secured thereto. For example, if there are three conductors, the hanger 222 can have a diamond shape (see FIG. 1) or a triangular shape (see FIGS. 4-5). A plurality of insulators 226 for insulating the insulated conductors 230 from one another are positioned between therebetween can further be incorporated in the hanger 222, such that the insulators 226 are positioned between the conductors 230.

The messenger 215 and/or the hanger system 220 can incorporate a breakaway or release feature. Because it is undesirable to install/replace a power pole 205p, if an object falls on an element of the distribution system 200, the messenger 215 or hanger system 220, incorporating the breakaway or release feature, is adapted to either break and/or release upon the object falling thereupon. This feature can save the power pole 205p from damage, and ultimately eases the task and cost of replacing the fallen wires or reconductoring.

The conductors 230 in this arrangement are insulated conductors 231. Insulated conductors 231, often referred to as tree wires, covered wires, and covered conductors, have an exterior of insulated material, for example, rubber. As shown in FIGS. 1 and 4, there can be three insulated conductors 231 hanging from the hanger system 220. Each insulated conductor 231 includes a conductor core 232 for transmitting electricity, and an insulated exterior 234. When there are more than one insulated conductor 231, and they are bundled together in this space-saving arrangement; conductors in this arrangement are referred to as bundled conductors.

Referring now to FIGS. 1-6B, the sensor system 300 is illustrated. The sensor system 300 is adapted to sense whether the insulated conductors have fallen, and if so to alert that such an event occurred. The sensor system 300 includes a communication cable 305, a notification assembly 310, and a signal processing system 350.

The communication cable 305 is used to monitor the status of the distribution system 200. The communication cable 305 can be many types of cabling, such as a fiber optic cable, coaxial cable, copper cable, and the like. In one embodiment, the communication cable 305 is a fiber optic cable, although other cables can be used in the sensor system 300. The communication cable 305 can be received by the notification assembly 310.

The notification assembly 310 is adapted to notify an operator the status of the distribution system 200. In an exemplary embodiment, the notification assembly 310 is a disruption assembly that can disrupt, bend, cut, pierce, or slice the communication cable 305. For example and not limitation, because of its inherent characteristics, if a fiber optic cable is selected as the communication cable 305, then the disruption assembly 310 need only bend or pierce the cable for disruption the signal being transmitted therein.

As illustrated in FIG. 1, the disruption assembly 312 includes a body 314, a cable receiving channel 316, and a disruption device 318. The body 314 of the disruption assembly 312 can be positioned nearby the distribution system 200. For instance, as depicted in FIG. 1, the disruption assembly 312 is positioned beneath the messenger 215 and secured to the power pole 205$p$. The disruption assembly 312 can alternatively be positioned above the messenger 215 and secured to the power pole 205$p$, on the arm 210 extending from the power pole 205$p$, integral therewith, or elsewhere, such that the disruption device 318 is loaded with the potential to bend, snap, pierce, slice, and/or cut the communication cable 305.

The disruption device 318 of the disruption assembly 312 can be tethered to an element of the distribution system 200, for example, the messenger 215. The tether 320 that connects the disruption device 318 to the messenger 215 is preferably primarily composed of Aluminum wiring, though other preferably non-rusting leashes, wire, and/or strings can be used.

The disruption device 318 is positioned with the potential of disrupting the cable 305. For example, the disruption device 318 can be actuated to cut the cable 305. Because the cable 305 rests within the channel 316 of the disruption assembly 312, the disruption device 318 can knife through the communication cable 305 via a blade 306, which can be a stainless steel cutting blade. When the bundled conductor 235 falls, the arm 210 holding the bundled conductor 235 is releasable or breakable, and consequently the messenger 215 falls. As a result, the disruption device 318 can move and slice the communication cable 305. In other embodiments, the disruption device 318 can make contact with the communication cable 305 to disrupt, bend, and/or pierce the cable, such that disruption of the signal traveling through the communication cable 305 occurs.

Figure 6A:
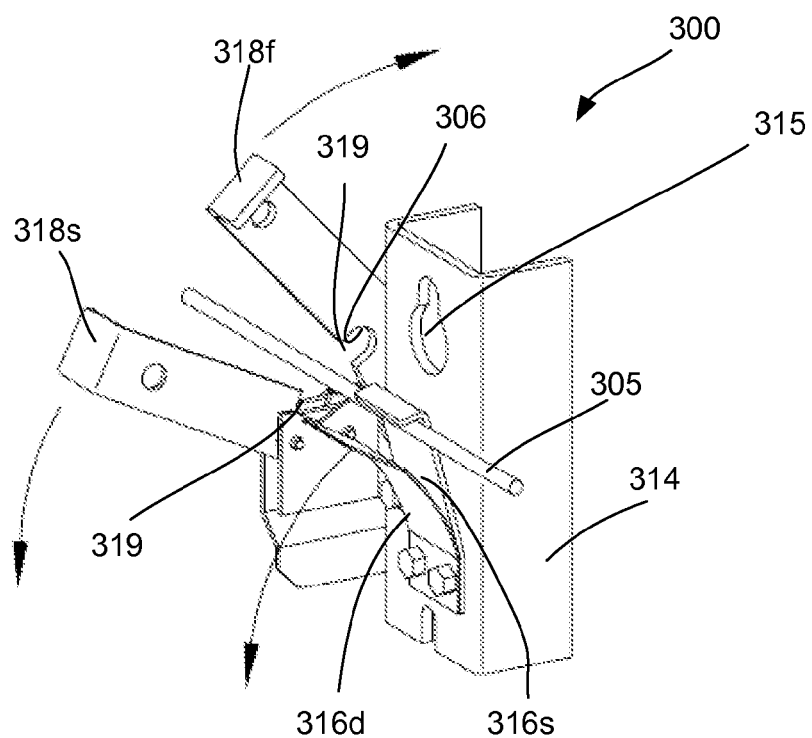
FIG. 6A illustrates a perspective view of the disruption assembly in an open state, in accordance with an exemplary embodiment of the present invention.
Figure 6B:
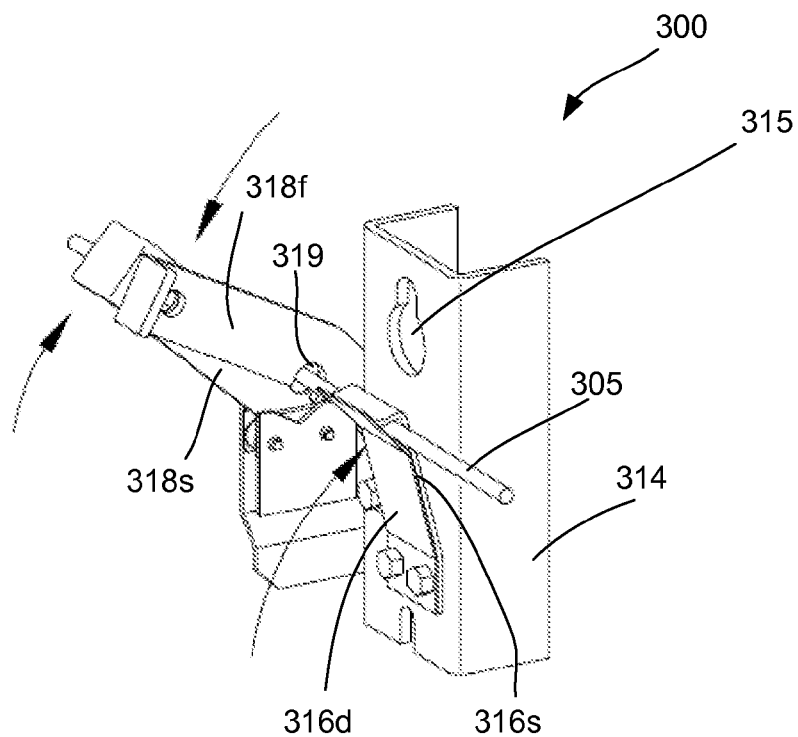
FIG. 6B illustrates a perspective view of the disruption assembly in a closed state, in accordance with an exemplary embodiment of the present invention.

As shown in FIGS. 5 and 6A-6B, the disruption assembly 310 can have an open state and a closed state. First, as illustrated in FIGS. 5 and 6A, the disruption assembly 310 is in the open state. When the disruption assembly 310 remains in the open state, an object has not yet fallen on an element of the distribution system 200. The majority of the time, the disruption assembly 310 will remain in this open state. When in the open state, the disruption assembly 310 maintains the potential to move to the closed state. Second, as illustrated in FIG. 6B, when an object falls on an element of the distribution system 200, the disruption assembly 310 falls into the closed state, causing the disruption device 318 to bend, snap, pierce, slice, and/or cut the communication cable 305. Consequently, when the disruption assembly 310 enters its closed state, a warning can be generated to alert that an event, such as an object falling on an element of the distribution system 200, has occurred.

As shown in FIGS. 1 and 6A-6B, the disruption assembly 310 can include the body 314, which is securable to the arm 210 or the pole 205$p$. If the disruption assembly 310 is to be secured to the arm 210 or pole 205$p$ by a boring means, the body 314 can define an aperture 315. The aperture 315 is adapted to receive a portion of bolt or other securing means for attachment to the arm 210 or pole 205$p$. Additionally, the communications cable 305 can be carried by the body 314 of the disruption assembly 310 by both the cable receiving channel 316 and a two-element disruption device 318. The cable receiving channel 316 and the two-element disruption device 318 are coupled to the body 314.

In the exemplary embodiment of FIGS. 6A-6B, the method of installing the cable 305 to the disruption assembly 310 is illustrated. The cable receiving channel 316 can comprise a static element 316$s$ and a dynamic, or movable, element 316$d$. The static element 316$s$ preferably does not move, while the dynamic element 316$d$ is adapted to move. Accordingly, the cable 305 can be secured between the elements 316$d$ and 316$s$, such that the cable 305 does not fall from the disruption assembly 310. In an exemplary embodiment, and as illustrated in FIG. 6A, the dynamic element 316$d$ can move away from the static element 316$s$, which as illustrated by the arrow can be downwardly for inserting the cable between the elements 316$s$ and 316$d$.

Additionally, the two-element disruption device 318 can include a first arm 318$f$ and a second arm 318$s$. In one embodiment, the first arm 318$f$ can be static, such that it does not move. The second arm 318$s$ can be dynamic and charged with the potential to move if needed. Both the first arm 318$f$ and the second arm 318$s$ can define a cutout or aperture 319. The cutout 319 of both the first arm 318$f$ and the second arm 318$s$ can line up to one another, as shown in FIG. 6B. Accordingly, the cable 305 can be weaved therethrough (as shown in FIG. 6A), and secured therebetween once the two arms 318$f$ and 318$s$ are lined up. In another embodiment, both the first arm 318$f$ and the second arm 318$s$ are capable of movement, as illustrated by the arrows in FIGS. 6A-6B.

Figure 3:
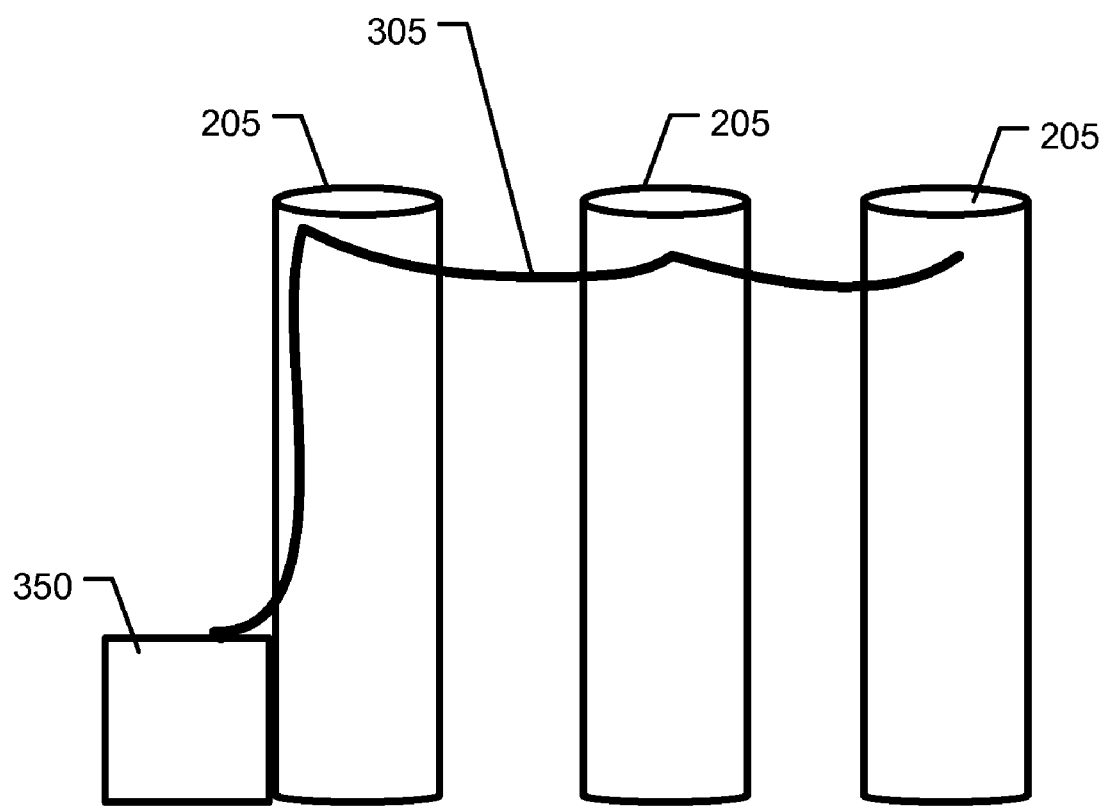
FIG. 3 illustrates an environment for a sensor system of the warning system, in accordance with an exemplary embodiment of the present invention.

The signal processing system 350, as shown in FIG. 3, is positioned near at least one of the power poles 205$p$. The signal processing system 350 can provide a signal, such as a pulsed or continuous signal, to be transmitted through the communication cable 305. For example, if the communication cable 305 is a fiber optic cable, the signal processing system 350 can send a light signal through the fiber optic cable. The light travels along the communication cable 305 until it reaches either another signal processing system 350 or the same signal processing system 350 that transmitted the light in the first case. If, for some reason, the light does not reach the designated signal processing system 350, an operator is alerted. At that time the operator can decide whether to prompt with another signal through the signal processing system 350, to send a line operator to check on the status of the conductors, and/or kill power to the area.

One of many advantages with using a fiber optic cable for the communication cable 305 is many fiber optic cables include more than one fiber. Accordingly, a single fiber optic cable can be used to travel along the cable, and a second "return" cable is not necessary. As shown in FIG. 3, the signal processing system 350 can transmit a signal along the fiber optic cable. When the signal reaches the terminus of the cable, by tying one fiber of the fiber optic cable to another fiber, the signal can be returned. Further, if there are more fibers (often there are four fibers in a fiber optic cable), they can be used for other communication purposes, such as high speed internet, telephone communications, and the like. If a coaxial cable is provided, either a splice and/or router to route to a second coaxial cable, or a subsequent signal processing system to receive and transmit is needed at the termination point of the cable.

An aspect of the present invention includes a warning system to alert an operator of conductors (i.e., utility company) that an insulated conductor has fallen. A communication cable runs alongside power poles holding the monitored wire, such as a bundled insulated conductor, aloft. If/when the bundled conductor falls, a mechanical event can slice the communication cable, such as a coaxial or fiber optic cable, with a cutter assembly that is secured to the pole.

Oftentimes, bundled conductors are insulated from the ground, such as with an insulative covering. Thus, if a person standing on the ground were to touch a live bundled conductor, the ground for the system would be provided, and hence that person could be electrocuted. Unfortunately, conventional protection schemes are not effective in determining when the conductor is in reach of the public. The bundled conductor warning system can determine when a bundled conductor falls, and can alert an operator of the fallen bundled conductor.

The bundled conductor warning system comprises, for example, a fiber optic cable running alongside power poles that carry the bundled conductors. When the conductors fall (often due to a tree/branch falling on the power lines/conductors) the disruption assembly can disrupt the signal being transmitted through the cable.

In an exemplary embodiment, the cutter assembly is in communication to the power pole, and has the potential to cut the cable when the conductors fall. The fiber optic cable is positioned in an aperture of the cutter assembly. The cutting device of the cutter assembly is tethered to the messenger, which is designed to hold the bundled conductor to the arm. When the conductors fall, the arm holding the bundled conductor is breakable, and consequently the messenger falls. As a result, the cutting device is caused to move downwardly and disrupts/slices the fiber optic cable. This is generally illustrated by the arrow in FIG. 5.

A light being transmitted (constantly or pulsed) in the fiber optic cable can be monitored by a signal processing system, or signal box. The signal box both transmits and monitors the light. If a light signal returns to the signal box after traveling the length of the cable, the line is fine, and it is presumed that no bundled conductors have fallen. If, however, the light signal does not return to the signal box (for example, when the fiber optic cable is cut by the cutter assembly), then it is presumed that the bundled conductor may have fallen. A communication device (such as a modem) at the signal box can transmit an alarm, and an operator can either decide to remotely trip a protective device to turn off the electricity, or send someone to patrol the power lines.

In an exemplary embodiment, a warning system comprises a support structure; an arm carried by the support structure and extending outwardly therefrom; a distribution system providing a utility via at least one wire, the wire held aloft from a below surface via the arm; a communication cable transmitting a signal; a disruption assembly carrying the communication cable and in communication with the support structure, the disruption assembly loaded with the potential of disrupting the signal transmitted by the communication cable; and a sensor system for monitoring the distribution system based on the signal transmitted by the communication cable.

In exemplary embodiments, the at least one wire can comprise an insulated conductor transmitting electricity therethrough. The support structure can comprise a power pole. The arm can comprise a breakaway or release means, such that when an object falls on the distribution system the arm breaks or releases at the breakaway or release means. The arm can be positioned near a top of the support structure and can carry both the wire and communication cable, which are positioned near an end of the arm opposite to the support structure.

In additional exemplary embodiments, the warning system can further comprise a messenger device comprising a cable and comprising conductive characteristics, the messenger carried by the arm; and a hanger system carried by the messenger and carrying the at least one wire.

The disruption assembly of warning system can comprise a disruption device for interrupting the signal transmitted through the communication cable.

In an exemplary embodiment, the warning system provides notification of a fallen conductor and comprises both a power distribution system distributing electrical power and a sensor system for sensing whether the power distribution system is operating properly. The power distribution system comprises: at least one insulated conductor; a support structure; an arm coupled to the support structure and extending outwardly therefrom; a messenger device connected near a far end of the arm, opposite the support structure, the messenger device comprising conductive characteristics; and a hanger system for securing the at least one insulated conductor aloft, the hanger system carried by the messenger. The sensor system comprises a communication cable transmitting a signal; a disruption assembly comprising a channel for carrying the communication cable, the disruption assembly adapted to disrupt the signal transmitted by the communication cable upon the occurrence of an event; and a signal processing system for providing the signal to the communication cable.

In exemplary embodiments, the hanger system comprises a hanger comprising a plurality of clamps defining a channel sufficiently large enough to receive and secure the at least one insulated conductor. The support structure comprises a plurality of power poles, each positioned in an approximate vertical orientation and distant from another. The arm comprises a breakaway or release mechanism, such that when an object falls on the distribution system the arm breaks or releases at the breakaway or release mechanism. Also, the arm can be positioned near a top of the support structure, and the wire and communication cable can be positioned near an opposing end of the arm relative to the support structure.

In addition, the communication cable can comprise a fiber optic cable. The disruption assembly can comprise a cutting device for slicing the communication cable. The signal processing system generates a continuous signal to be transmitted by the communication cable. Alternatively, the signal processing system generates a pulsed signal to be transmitted by the communication cable.

Also, the sensor system can further comprise a communication device for remotely communicating the status of the sensor system. Exemplarily, the disruption assembly can be integral with the arm.

The disruption assembly of the warning system can comprise a body; a channel for receiving the communication cable; and a disruption device tethered to an element of the messenger and loaded with the potential of disruption the signal transmitted by the communication cable.

Embodiments also relate to a method of monitoring the status of an insulated conductor to determine if the insulated conductor has fallen. Exemplarily, the method comprises transmitting a signal through a communication cable; monitoring the signal transmitted through the communication cable at predetermined locations; and generating a notification upon failure of the signal to reach a predetermined signal receipt point. The method can further comprise extending the communication cable along a plurality of power poles.

While embodiments of the invention have been disclosed in its preferred forms, it will be apparent to those skilled in the art that many modifications, additions, and deletions can be made therein without departing from the spirit and scope of the invention and its equivalents, as set forth in the following claims.

What is claimed is:

1. A warning system comprising:
   a support structure;
   an arm carried by the support structure and extending outwardly therefrom;
   a distribution system providing a utility via at least one wire, the wire held aloft from a below surface via the arm;
   a communication cable transmitting a signal;
   a disruption assembly carrying the communication cable and in communication with the support structure, the disruption assembly loaded with the potential of disrupting the signal transmitted by the communication cable, wherein a disruption in the signal indicates the wire has fallen; and
   a sensor system for monitoring the distribution system based on the signal transmitted by the communication cable.

2. The warning system of claim 1, the at least one wire comprising an insulated conductor transmitting electricity therethrough.

3. The warning system of claim 1, the support structure comprising a power pole.

4. The warning system of claim 3, the arm comprising a breakaway or release means, such that when an object falls on the distribution system, the arm breaks or releases at the breakaway or release means.

5. The warning system of claim 1, the arm positioned near a top of the support structure, the arm carrying both the wire and communication cable, which are positioned near an end of the arm opposite to the support structure.

6. The warning system of claim 1, further comprising:
   a messenger device comprising a cable and comprising conductive characteristics, the messenger device carried by the arm; and
   a hanger system carried by the messenger device and carrying the at least one wire.

7. The warning system of claim 1, the disruption assembly comprising a disruption device for interrupting the signal transmitted through the communication cable.

8. A warning system providing notification of a fallen conductor, the warning system comprising:
   a power distribution system for distributing electrical power, the power distribution system comprising:
      at least one insulated conductor;
      a support structure;
      an arm coupled to the support structure and extending outwardly therefrom;
      a messenger device connected near a far end of the arm, opposite the support structure, the messenger device comprising conductive characteristics; and
      a hanger system for securing the at least one insulated conductor aloft, the hanger system carried by the messenger device; and
   a sensor system for sensing whether the power distribution system is operating properly, the sensor system comprising:
      a communication cable transmitting a signal;
      a disruption assembly comprising a channel for carrying the communication cable, the disruption assembly adapted to disrupt the signal transmitted by the communication cable upon the occurrence of an event, wherein a disruption in the signal is indicative of the occurrence of the event; and
      a signal processing system for providing the signal to the communication cable.

9. The warning system of claim 8, the hanger system comprising a hanger comprising a plurality of clamps defining a channel sufficiently large enough to receive and secure the at least one insulated conductor.

10. The warning system of claim 8, the support structure comprising a plurality of power poles, each positioned in an approximate vertical orientation and distant from another.

11. The warning system of claim 8, the arm comprising a breakaway or release mechanism, such that when an object falls on the distribution system, the arm breaks or releases at the breakaway or release mechanism.

12. The warning system of claim 11, the arm positioned near a top of the support structure; the at least one insulated conductor and the communication cable positioned near an opposing end of the arm relative to the support structure.

13. The warning system of claim 8, the communication cable comprising a fiber optic cable.

14. The warning system of claim 8, the disruption assembly comprising a cutting device for slicing the communication cable.

15. The warning system of claim 8, the signal processing system generating a continuous signal transmitted by the communication cable.

16. The warning system of claim 8, the signal processing system generating a pulsed signal transmitted by the communication cable.

17. The warning system of claim 8, the sensor system further comprising a communication device remotely communicating the status of the sensor system.

18. The warning system of claim 8, the disruption assembly integral with the arm.

19. The warning system of claim 8, the disruption assembly comprising:
   a body;
   a channel receiving the communication cable; and
   a disruption device tethered to an element of the messenger device and loaded with the potential of disrupting the signal transmitted by the communication cable.

20. A method of monitoring the status of an insulated conductor to determine if the insulated conductor has fallen in an electrical distribution system comprising at least one insulated conductor, a support structure, an arm coupled to the support structure and extending outwardly therefrom, a messenger device connected near a far end of the arm opposite the support structure, and a hanger system carried by the messenger device for securing the at least one insulated conductor aloft, the method comprising:

transmitting a signal through a communication cable, the communication cable carried by a channel in a disruption assembly, the disruption assembly disrupting the signal transmitted by the communication cable upon the occurrence of an event;

monitoring the signal transmitted through the communication cable at predetermined locations with a sensor system; and generating a notification upon failure of the signal to reach a predetermined signal receipt point.

21. The method of claim 20, further comprising extending the communication cable along a plurality of power poles.

* * * * *